LIQUID DISPLACEMENT ELECTRIC CIRCUIT FORMING DEVICE

Filed Jan. 12, 1962 3 Sheets-Sheet 1

INVENTOR.
DONALD H. LANCTOT
BY Elliott & Pastoriza
ATTORNEYS

LIQUID DISPLACEMENT ELECTRIC CIRCUIT FORMING DEVICE

Filed Jan. 12, 1962 3 Sheets-Sheet 2

INVENTOR.
DONALD H. LANCTOT
BY Elliott & Pastoriza
ATTORNEYS

LIQUID DISPLACEMENT ELECTRIC CIRCUIT FORMING DEVICE

Filed Jan. 12, 1962 3 Sheets-Sheet 3

INVENTOR.
DONALD H. LANCTOT
BY Elliott & Pastoriza
ATTORNEYS 3,184,693

LIQUID DISPLACEMENT ELECTRIC CIRCUIT FORMING DEVICE

Donald H. Lanctot, Malibu, Calif.; Jeanette Lanctot, executrix of Donald H. Lanctot, deceased, assignor to Lantronics, Inc., Santa Monica, Calif., a corporation of California Filed Jan. 12, 1962, Ser. No. 165,785
4 Claims. (Cl. 333—24)

This invention relates generally to electrical devices and more particularly to novel structures in which an electrical configuration is formed through the medium of a conducting liquid.

First embodiments of the instant invention have to do with novel switch structures wherein two or more terminals are connected by means of a conducting liquid. Other embodiments of the invention relate to novel coupling circuits, variable attenuators, and other structure realizable by employing the conducting liquid principle of the invention.

With respect to switches, present day electrical switches in both conventional power applications and high frequency communication systems such as in co-axial cables and the like, usually rely on a movable electrically conducting member for effecting contact between two or more terminals. In other instances, the bridging member itself may be caused to engage simultaneously two terminals to be connected together when the switch is to be closed and to simultaneously disengage such terminals when the switch is to be opened.

In all of the foregoing types of switches, certain problems arise. For example, in the case of conventional electrical switching, there is the ever present problem of contact wear between the bridging member and the terminal or contacts with which it comes into constant engagement and disengagement. Further, such wear can vary the electrical characteristics of the switch. For example, dirt or grit or corrosion of the contact points can increase the resistance across the switch itself. There is thus lacking a desired consistency of operation.

The foregoing problem becomes important in ultrahigh frequency applications wherein a uniform electrical connection is required to avoid reflections of electro-magnetic energy. In addition, proper dimensioning of the bridging element itself is important. For example, in the case of co-axial lines, it is desirable to effect a connection between two lines by bridging members which are dimensioned substantially the same as the lines themselves, thereby avoiding discontinuities which can cause reflections and thus establish undesired standing waves.

Another important consideration in conjunction with presently known types of electrical switches both for low frequency and high frequency applications is the response time for effecting a given switching action. If the switch is to have large power handling capabilities, the bridging member between two terminals to be connected together must be of appreciable dimensions. On the other hand, it is desirable to be able to close or open a connection as quickly as possible. In cases in which a relatively large movement of a bridging element is necessary, there are necessarily introduced limitations with respect to the speed of response.

With the foregoing in mind, a first object of this invention is to provide a novel electrical switch wherein many of the foregoing problems are overcome.

More particularly, it is an object to provide a novel electrical switch which provides a consistently excellent contact throughout a long period of operation and wherein the bridge between terminals to be connected is automatically uniformly dimensioned with respect to the terminals themselves so that when the switches are incorporated in high frequency components, minimum discontinuities are presented.

Another object of this invention is to provide a novel switch having a very short response time and yet capable of handling relatively large amounts of power.

A particular object of the invention is to provide a novel electrical switch for use in striplines in high frequency systems.

Another particular object is to provide a novel type of co-axial shutter.

Other objects of this invention are to provide novel structures for forming different types of electrical circuits to carry out various functions in addition to switching functions such as the provision of variable coupling circuits, antenna, variable capacitance circuits, and so forth.

Briefly, these and many other objects and advantages of this invention are attained by incorporating a conducting liquid within a body member to serve as a circuit forming medium for one or more terminals to be connected or coupled into a given circuit. One or more physical paths are defined by recessed areas such that when the areas are filled with the conducting liquid, the desired circuit is formed.

A portion of the body member defining the recessed area is adapted to hold a given quantity of electrically conducting liquid metal such as mercury. Disposed over the entire area is a flexible diaphragm such that application of a force to the diaphragm to compress the conducting liquid will cause lateral displacement thereof throughout the entire recessed area and thus define the desired circuit. The natural meniscus properties of the liquid itself will return the liquid to its original position when the pressure or force applied to the diaphragm has been relieved.

In the case of switches, the liquid will connect two or more terminals when pressure is applied to the diaphragm.

Since a conducting liquid is employed, excellent and consistent electrical contact is assured between various terminals, there being substantially no wear or change in resistance across the contacts. Moreover, because of the ability of the liquid to conform to the shape of its confining means, the recessed areas defining various electrical connections can be properly shaped for maximum power transfer. For example, such shaping is important in co-axial connections or in stripline switches wherein the center stripline is of given dimensions.

In the preferred embodiment of the invention, a simple solenoid and plunger structure is employed to provide the desired force on the diaphragm to effect the lateral displacement of the liquid. By proper design of the recessed area and the quantity of liquid employed, only a very slight motion of the solenoid plunger is required to effect relatively large lateral displacements. As a consequence, the armature of the solenoid structure may be disposed relatively close to the actuating electro-magnetic coils therefor, to the end that a very large force may be generated for the short distance involved without requiring large components. Thus, extreme miniaturization of the switch is possible.

In applications other than switches, the liquid may be displaced into various differently shaped paths defining coupling elements, antennas, or the like. In a particular embodiment, two recessed areas are employed, each containing a liquid so that when both are subject to pressure, large opposed areas of conducting liquids are provided serving to define condenser plates so that an adjustable capacitance is created.

A better understanding of the invention will be had by referring to preferred embodiments thereof as illustrated in the accompanying drawings, in which.

The incorporation of the principles of the invention for switches will first be described.

Figure 1:
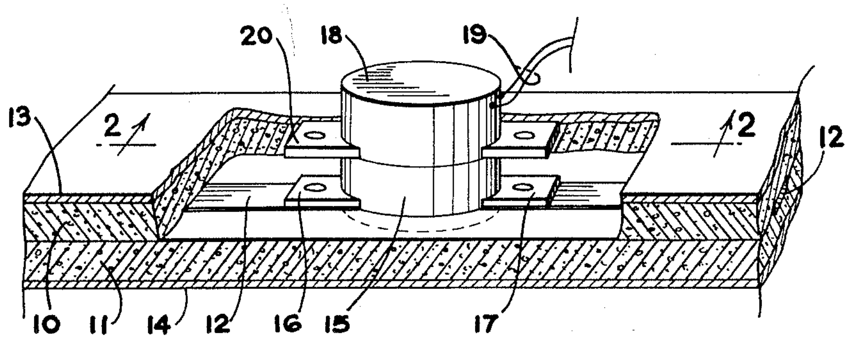
FIGURE 1 is a perspective broken away view of a high frequency stripline incorporating a switch in accordance with the present invention.

Referring first to FIGURE 1, there is shown by way of example a pair of stripline members 10 and 11 comprising dielectric material and serving to enclose a stripline center conductor 12 as shown in the broken-away portion. The top exterior surface of the member 10 and the bottom exterior surface of the member 11 are covered with ground conducting plates as indicated at 13 and 14, respectively.

Heretofore, when it was desired to provide a switch in the transmission line defined by the stripline type inner and outer conductors, a portion of the center line 12 was cut out and a pair of co-axial connectors terminating in probes extending normally into the stripline were coupled to the opposing ends of the center conductor. The upper ends of the co-axial connectors were then connected through a co-axial switching unit. Clearly, this represents a rather bulky and expensive arrangement for effecting a simple switching operation.

In accordance with first embodiments of the present invention, a novel switch is provided as indicated generally by the numeral 15 in conjunction with the stripline conductors. The switch includes terminals 16 and 17 secured to opposed portions of the strip line 12 after a center section has been removed therefrom. A housing 18 serves to confine a solenoid energized through leads 19 to operate the switch. The entire structure is secured by flanges 20 and 21 to the top of the dielectric member 10.

Figure 2:
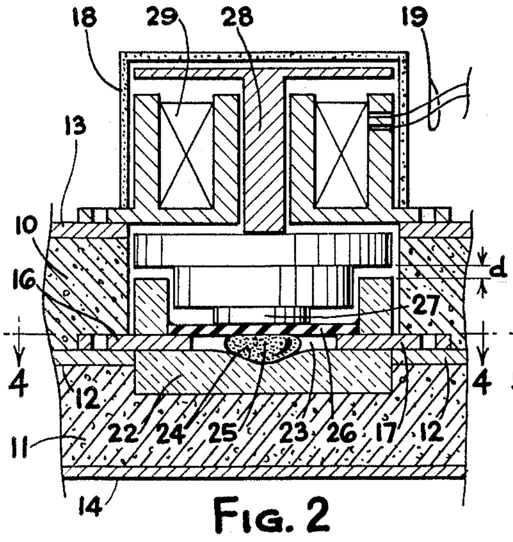
FIGURE 2 is a view partly in cross section with certain portions shown in full lines taken in the direction of the arrows 2—2 of FIGURE 1 and illustrating the switch in its open condition.
Figure 4:
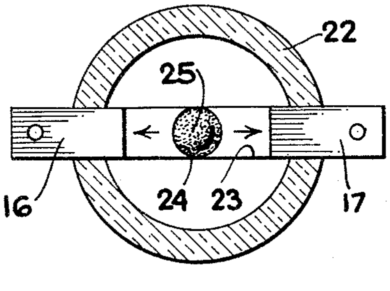
FIGURE 4 is a cross section plan view taken in the direction of the arrows 4—4 of FIGURE 2.

With particular reference to the cross sections of FIGURES 2 and 4, the switch includes a body 22 having a rectangular recessed channel area 23. A central portion of this recessed area includes a deeper cavity or central depression 24. This latter area is designed to hold a given quantity of electrically conducting liquid such as mercury 25. A diaphragm 26 in turn is disposed above the recessed area and arranged to be moved normally downwardly to compress the liquid 25.

In accordance with the particular embodiment disclosed, the movement of the diaphragm is effected by a cylindrical structure of stepped design as shown so that it may be guided in a normal direction towards the lower body. The central lower end 27 of the cylindrical structure engages the diaphragm as shown, and the upper end is engaged by a solenoid plunger 28 surrounded by coils 29. When the coils 29 are deenergized, the solenoid 28 is in the upper position as shown and the liquid metal 25 forms in a central globule wherein neither of the terminals 16 or 17 is engaged thereby, as most clearly shown in FIGURE 4.

Figure 3:
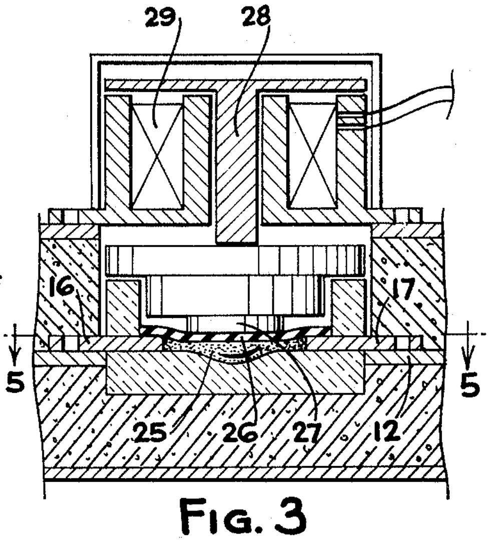
FIGURE 3 is a view similar to FIGURE 2 illustrating the switch in its closed position.
Figure 5:
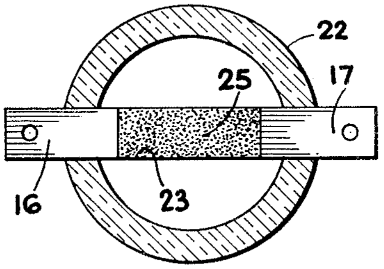
FIGURE 5 is a view similar to FIGURE 4 taken in the direction of the arrows 5—5 of FIGURE 3.

Referring now to FIGURES 3 and 5, when the coils 29 are energized to pull the plunger 28 downwardly, it will, through the medium of the cylindrical structure 27 compress the diaphragm 26 and the liquid metal 25 to cause the liquid to be partially displaced laterally so that the recessed area is substantially filled. The resulting configuration is more clearly illustrated in FIGURE 5 wherein it will be noted that the terminals 16 and 17 are in full conducting contact with the liquid mercury 25. Further, it will be clear that the effective bridging of the terminals 26 and 27 is achieved by a liquid bridging strip which itself is of substantially the same dimensions as defined by the recessed or channel area 23 in the body 22.

When the pressure is relieved from the diaphragm 26, the resiliency of the diaphragm together with the compressed air beneath the diaphragm and tendency for the liquid metal to form into a ball by cohesion will return the diaphragm to the position illustrated in FIGURES 2 and 4 and thus raise the plunger.

It will be particularly noted that it is only necessary for the plunger 28 to move a very short distance as indicated by the letter *d* in FIGURE 2. This small movement will result in a large lateral movement of the liquid metal, depending, of course, on the thickness dimensions of the bridging connection to be made. The thinner the final configuration or the less depth of the recess involved, the greater will be the lateral movement of the liquid for a given vertical movement of the plunger structure. An important feature of the invention resides in the fact that only a very small movement is required to effect an electrical bridge between relatively widely spaced points. As a consequence, the plunger 28 may be disposed relatively close to the coils 29 so that a large force is developed even though the overall structure is relatively small.

Another advantage of the instant invention resides in the use of a liquid metal itself. Liquid metal contacts are known in the art to provide a consistently excellent connection without wear and without any appreciable power loss at the transfer point. This result is because of the large contact area afforded by the use of a liquid in conjunction with a metallic terminal or contact.

While the particular embodiment described has been set forth in conjunction with a stripline transmission system, it will be evident that the principles thereof are applicable to any type switch in which it is desired to connect two electrical conductors together, the same being secured to the terminals 16 and 17. The arrangement essentially corresponds to a single pole, single throw switch.

Figure 6:
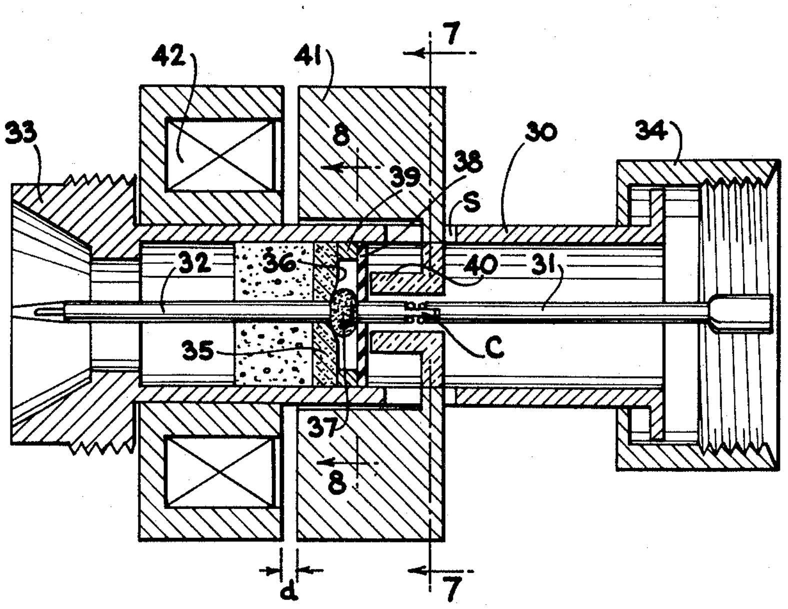
FIGURE 6 is a cross-sectional view of a shutter incorporating the switch in accordance with a second embodiment of this invention for use in a co-axial line.

Referring now to FIGURE 6, there is shown a second embodiment of the invention, wherein the switch is employed as a shutter in a co-axial transmission line. Towards this end, there is illustrated a section of co-axial line including an outer conductor 30 and an inner conductor 31. The inner conductor is cut at its center portion to define a second inner conducting portion 32 as shown to the left of the drawing. This conducting portion 32 cooperates with an end connector 33 threaded as shown for connection to one end of a co-axial line. The opposite end terminates in a coupling 34 arranged to co-operate with an end coupling similar to that shown at 33 for connection to another co-axial line.

The switch itself includes an annular body member 35 having a recessed area 36 which, in this case, is conically shaped having its deepest portion in its center and its shallowest portions towards the peripheral edge of the body. A conducting liquid 37 is shown formed into a central cohesive mass which connects the inner conductors 31 and 32 at all times. Also provided is a diaphragm 38 secured to an annular conducting ring 39 which is in contact over 360 degrees with the interior of the outer conductor 30 of the co-axial line. This ring 39 serves as one terminal for the switch, and the inner conductors 31 and 32 constitute the other terminal.

Figure 7:
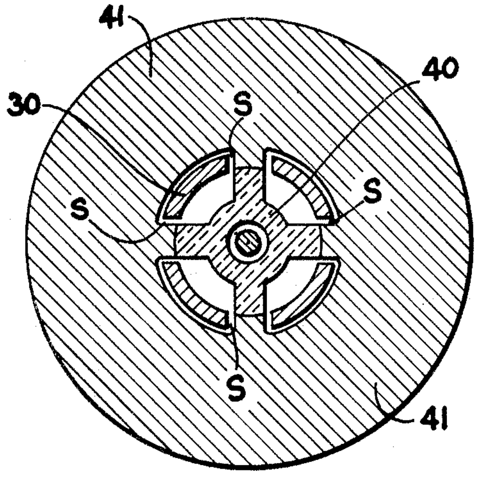
FIGURE 7 is a cross section taken in the direction of the arrows 7—7 of FIGURE 6.

A plunger structure 40 serves as a force actuating means for compressing the liquid 37 within the recessed portion of the body 35. In order that the pressure be applied uniformly over 360 degrees, the structure is ring shaped as shown in FIGURE 7 and includes four radially directed arms passing through slots in the outer conductor 30 and terminating in an annular armature structure 41 of magnetic material. Annular coils 42 in turn are positioned about the outer conductor 30 of the co-axial line as shown so that longitudinal movement of the ring 41 will result when the coils 42 are energized to cause compression of the liquid 37 in the switching member.

The particular distance over which the armature moves is extremely small as indicated by the letter *d* in FIGURE 6. This distance is greatly exaggerated for purposes of clarity. The movement itself is accommodated by the slots S in the outer conductor which need not be appreciably longer than the distance *d*. A telescoping spring coupling C is incorporated in the center conductor 31 to accommodate this movement.

Figure 8:
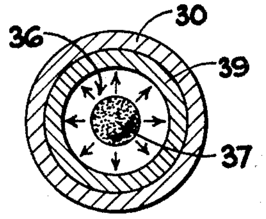
FIGURE 8 is another cross section taken generally in the direction of the arrows 8—8 of FIGURE 6 showing the co-axial shutter in open or normal condition for transmitting energy.
Figure 9:
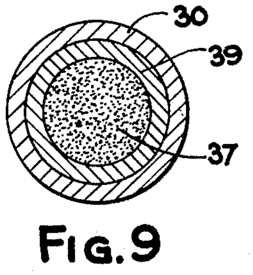
FIGURE 9 illustrates the shutter in closed condition in which transmission of energy down the line is effectively blocked.

Referring now to FIGURES 8 and 9, the flow of the liquid metal is indicated when the switch is de-energized and when it is energized. Thus, in FIGURE 8, the globule of metal 37 is shown in the center completely isolated from the annular ring 39. On the other hand, when pressure is applied by the armature structure through energization of the electro-magnetic coils 42, the diaphragm compresses the liquid, causing it to extend radially in all directions uniformly as indicated by the arrows in FIGURE 8 until it strikes the outer ring 39 as shown in FIGURE 9 and thus provides a complete conducting surface, short circuiting the inner conductors of the co-axial line to the outer conductor. This arrangement results in substantially perfect isolation on either side of the switch and provides an excellent co-axial type shutter.

When the coils 42 are de-energized, the diaphragm will tend to spring back to its original position, and this force together with any compressed air within the recess 36 and the tendency for the liquid metal itself to form into a globule will result in the switch structure returning to the position illustrated in FIGURE 8. In its non-operated position, the diameter of the globule 37 approximates that of the inner conductors 31 and 32 so that excellent continuity is realized when the shutter is open.

Figure 10:
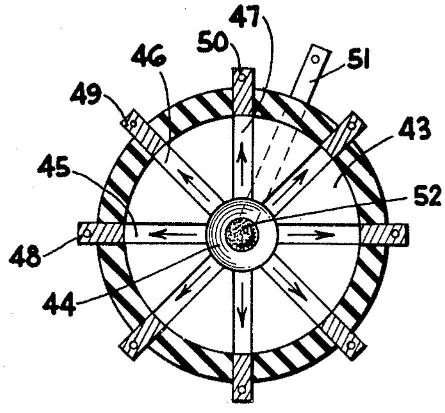
FIGURE 10 is a schematic plan view of a multiple switch structure in accordance with the present invention in a first condition.
Figure 11:
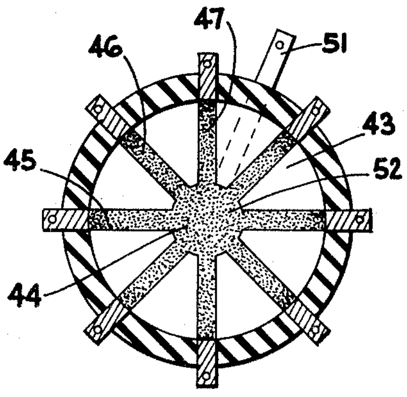
FIGURE 11 is a view similar to FIGURE 10 illustrating the switch in operated condition.

The principles described above in conjunction with the shutter may be employed to provide a multiple throw switching structure. Thus, with reference to FIGURES 10 and 11, there is shown a body member 43 including a recessed area of given configuration including a central recessed portion 44 and a plurality of radially extending channels or paths such as indicated at 45, 46, and 47. As shown in FIGURE 10, these paths terminate in small tabs or terminal connectors 48, 49, and 50. The various terminal connectors constitute output terminals and are held in insulated spaced relationship to each other about the periphery of the body 43 as shown. A single input connecting tab 51 may be provided to make contact with the center recessed portion of the area in the body 43. This center depressed area includes a globule of conducting liquid 52.

In the embodiment of FIGURE 10, there would be provided a covering diaphragm and suitable means for applying a compressive force to the globule of liquid 52. Upon application of this force, the liquid will be caused to move radially along the various paths as indicated by the arrows until the liquid engaged the various output terminal tabs as clearly illustrated in FIGURE 11. Thus, a multiple connection is simultaneously effected between the input connecting tab 51 and all of the various output tabs by means of the liquid displacement principles herein described.

FIGURES 12, 13, 14, and 15 illustrate various examples of the manner in which the principles of the present invention may be incorporated for carrying out various electrical functions in addition to that of switching.

Figure 12:
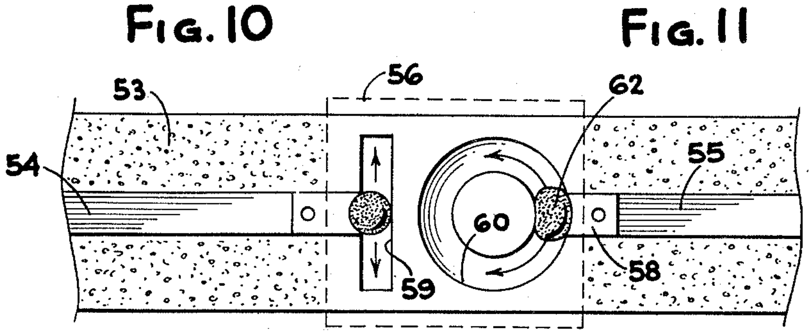
FIGURE 12 is another schematic plan view of further embodiments incorporating the principles of the present invention illustrating one type of coupling means useful in high frequency stripline structures.

As a first example, there is illustrated in FIGURE 12 a portion of a stripline 53 similar to the stripline described in conjunction with FIGURES 1, 2 and 3. As shown, the stripline includes a center strip conductor 54 which has a center portion cutout so that two opposing center portions are provided, the other being designated 55. A body member incorporating the liquid displacement device of this invention is illustrated in dotted lines at 56 arranged to be positioned over the cutout portion between the inner conductors 54 and 55 as shown.

In the particular structure illustrated in FIGURE 12, the body member 56 defines a coupling which may be incorporated to coupled energy between the conductor 54 and the conductor 55. Towards this end, there may be provided terminals 57 and 58 from the body 56 which connect to the strips 54 and 55. As shown, the terminal 57 is arranged to connect to a recessed area 59 having a configuration corresponding to a T structure. The body 56 also includes a recessed area merging with the second terminal 58 in the form of a circular recessed path 60 defining a loop. First and second globules of liquid conducting metal 61 and 62 are provided in deeper recessed portions of the respective recessed areas as shown in FIGURE 12.

In operation, a diaphragm structure and pressure applying means similar to that described in conjunction with FIGURES 1–3 is provided to simultaneously exert a pressure on the liquid globules 61 and 62. When such pressure is applied, the globules will be displaced in the direction of the arrows to fill the recessed areas defined by the paths 59 and 60, respectively. There is thus effectively provided a dipole antenna type structure in the recess 59 and a loop coupling structure in the recess 60 so that a degree of coupling is effected between the inner strip conductors 54 and 55.

It should be understood that a similar T type recessed area could be provided for the terminal 58 and arranged to extend parallel to the recessed area 59 for the terminal 57. With this arrangement, the degree of pressure exerted on the respective liquid metals incorporated in the recesses would determine the lateral extent to which they were urged so that the length of the T portions could be varied as a function of the pressure exerted. This length in turn would vary the degree of coupling or, in other words, the degree of attenuation present between the center strip 54 and the other strip 55. The structure thus provides in essence a variable attenuator.

Figure 13:
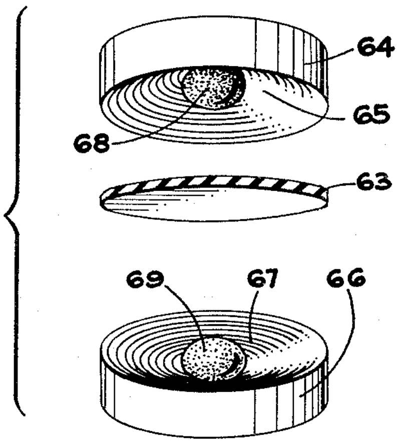
FIGURE 13 is a schematic exploded view of a variable capacitance formed in accordance with the principles of the invention.
Figure 14:
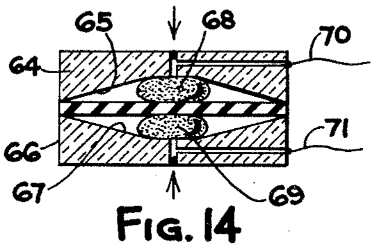
FIGURE 14 is a cross section of the structure shown in FIGURE 13 when in assembled condition to provide minimum capacitance; and, FIGURE 15 is a view similar to FIGURE 14 illustrating the operated condition wherein maximum capacitance is provided.
Figure 15:
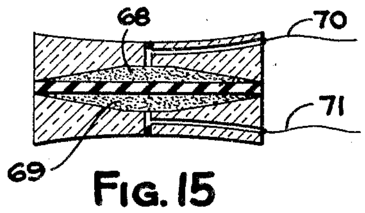

Referring now to FIGURES 13, 14, and 15, there is shown another embodiment of the invention wherein a variable capacitance is provided. Thus, with reference first to the schematic exploded view of FIGURE 13, there is provided a central member 63 of very thin dielectric material. A top cover body 64 includes a first recessed area 65 generally conically shaped, and a bottom cover body 66 includes a similar conically shaped recessed area 67. Globules of conducting liquid 68 and 69 are respectively received in the central portions of the recessed area, the two bodies 64 and 66 sandwiching the central member 63 therebetween. The assembled structure is illustrated in FIGURE 14. Suitable electrical conductors, as indicated at 70 and 71, may pass through the cover bodies 64 and 66, respectively, to connect to the central globules 68 and 69.

In the absence of any pressure on the opposite covers, the globules 68 and 69 will remain relatively centralized within the recessed areas. Under these conditions, there will be a minimum capacitance between the conductors 70 and 71.

On the other hand, as soon as pressure is applied in the direction of the arrows, the globules 68 and 69 will be radially displaced in all directions to define relatively large opposed areas which serve to define surfaces equivalent to plates of a condenser. The resulting configuration is shown in FIGURE 15. The capacitance between the conductors 70 and 71 is greatly increased as a consequence of the increased area. There is thus provided a variable capacitance which could serve as a simple pressure transducer.

It will be understood that in the embodiments of FIGURES 12–15, the means for applying the pressure and various other details such as diaphragms and the like have been omitted simply to avoid unnecessarily obscuring the drawings. The manner in which pressure is applied, however, may be similar to that illustrated in FIGURES 1, 2, and 3 for the stripline switch structure and, therefore, details with respect to these particular components are not believed necessary.

While only certain particular embodiments of the invention have been described, they are believed sufficient to illustrate the versatility of the liquid displacement device of this invention. In the first instance, it is possible to provide a substantially perfect continuation of a center stripline in the form of a rectangular bridge between two conductors. In the second embodiment, it is possible to provide a substantially perfect co-axial shutter by simultaneously shunting the center conductor to each and every point over 360 degrees of the outer conductor, providing essentially a perfect conducting wall to shut off or prevent transmission through the co-axial line.

In the remaining embodiments the manner in which various electrical circuits may be created or formed by a conducting liquid is shown. Thus, depending upon the particular shapes of the recessed areas within the body member, various different types of circuits or electrical components can be formed. The invention is therefore not to be thought of as limited to the various embodiments set forth merely for illustrative purposes.

What is claimed is:

1. A liquid displacement switch for use in a high frequency stripline center conductor of elongated rectangular shape, comprising, in combination: a body member having a generally rectangularly shaped channel, the central portion of said channel including a recessed area; a given quantity of electrically conducting liquid disposed in said recessed area; flat elongated rectangular shaped strip terminals extending into opposite ends of said channel normally out of contact with said liquid at their inner ends and adapted to have their outer ends connected into said stripline center conductor; a diaphragm positioned over said channel; and force means for applying a force against said diaphragm in a direction to displace said liquid throughout said rectangular channel to effect a bridging connection between said strip terminals, which bridging connection is dimensioned substantially similarly to said strip terminals whereby losses and reflection are minimized for high frequency energy passed through said stripline center conductor.

2. A liquid displacement switch shutter for use in a high frequency coaxial line having inner and outer conductors, comprising, in combination: a body member having a recessed area of shallow conical shape with its deepest point at a center corresponding with said inner conductor of said coaxial line and its shallowest portions adjacent to the interior of the outer conductor of said coaxial line; a given quantity of electrically conductive liquid disposed in the central portion of said recessed area; a first electrical terminal at the center of said recessed area in contact with said liquid and adapted to connect to said inner conductor of said coaxial line; and a second electrical terminal in the form of an annular ring secured to said body member to define the outer periphery of said recessed area, said ring being adapted to be in 360 degree electrical engagement with the interior of said outer conductor of said coaxial line; a diaphragm positioned over said recessed area; and a force means for applying a force against said diaphragm in a direction to displace said liquid uniformly in a radial direction to fill the entire recessed area and effect 360 degree contact with said ring, whereby said inner conductor is short circuited to said outer conductor at all interior points over a 360 degree circumference to provide substantially complete isolation between coaxial lines connected on either side of said switch shutter.

3. A liquid displacement device for providing a high frequency coupling circuit between first and second strip line center conductors comprising, in combination: a body member having first and second recessed areas of given configurations to propagate and receive electromagnetic waves; first and second given quantities of electrically conducting liquids disposed in portions of said recessed areas respectively; first and second terminals in electrical engagement with said liquids, said terminals being adapted to be connected to said first and second stripline center conductors respectively; and means for exerting pressure on said liquids to cause said liquids to move laterally and fill the remaining portions of said recessed areas to define respective circuit configurations for propagating and receiving said electromagnetic waves between said first and second stripline center conductors.

4. A liquid displacement device for providing a high frequency variable capacitance, comprising, in combination: a body member having first and second recessed areas of shallow conical configuration; given quantities of electrically conducting liquids in the central deepest portions of said recessed areas; and means for exerting a squeezing pressure on said liquids to cause said liquids to move laterally and fill further portions of said recessed areas, said recessed areas being positioned relative to each other to define parallel condenser plates when filled with said liquids, the degree of squeezing pressure exerted on said liquids controlling the extent said areas are filled by said liquids, whereby the capacitance between said liquids in a function of said pressure.

References Cited by the Examiner

UNITED STATES PATENTS

| | | | |
|---|---|---|---|
| 375,403 | 12/87 | Waterhouse | 200—152.9 X |
| 2,560,717 | 7/51 | Boyer | 200—152.9 |

BERNARD A. GILHEANY, *Primary Examiner.*

ROBERT K. SCHAEFER, *Examiner.*